United States Patent [19]

Hartman et al.

[11] Patent Number: 5,399,966
[45] Date of Patent: Mar. 21, 1995

[54] INDUCTION WATT-HOUR METER ROTARY DISC MOUNTING AND BEARING SYSTEM

[75] Inventors: Marinus Hartman, Pickering; Alain Roig, Toronto; Chesley R. Howell, Scarborough, all of Canada

[73] Assignee: Schlumberger Canada Limited, Toronto, Canada

[21] Appl. No.: 35,094

[22] Filed: Mar. 19, 1993

[30] Foreign Application Priority Data

Mar. 20, 1992 [CA] Canada .............................. 2,063,617-3

[51] Int. Cl.[6] ...................... G01R 11/02; G01R 1/38; G01R 5/20; G01R 11/36
[52] U.S. Cl. .............................. 324/137; 324/154 PB; 324/155
[58] Field of Search .................. 324/137, 152–155; 310/90.5; 335/225

[56] References Cited

U.S. PATENT DOCUMENTS

| | | | |
|---|---|---|---|
| 2,254,698 | 9/1941 | Hansen, Jr. | 324/155 X |
| 3,143,704 | 8/1964 | Wright | 324/155 |
| 3,309,152 | 3/1967 | Ramsey, Jr. et al. | 324/152 X |

*Primary Examiner*—Gerard R. Strecker
*Attorney, Agent, or Firm*—Sanford J. Asman

[57] ABSTRACT

An electro-mechanical induction watt-hour meter bearing system that includes end cap pilot bearings snap fit onto respective opposite ends of the shaft. The bearing system also includes a lower shaft support bearing selectively adjustable in increments for controlled adjustment.

6 Claims, 3 Drawing Sheets

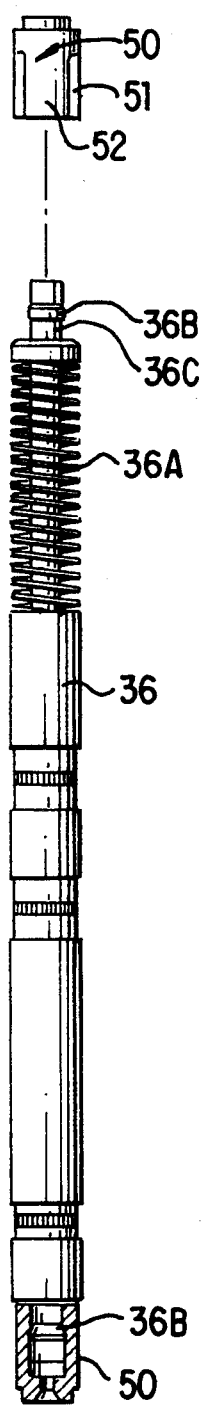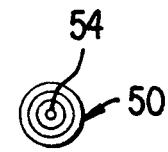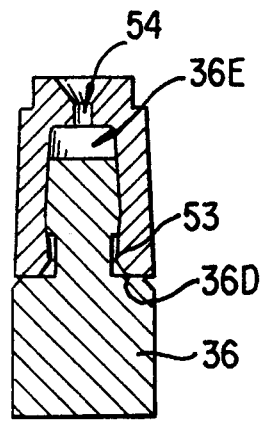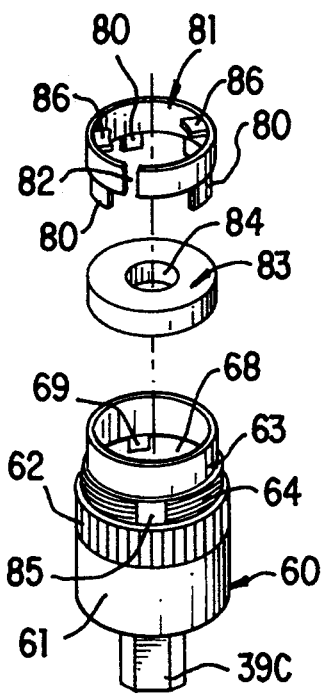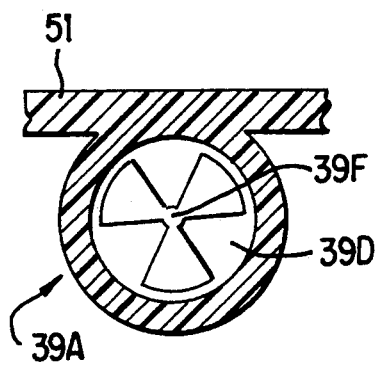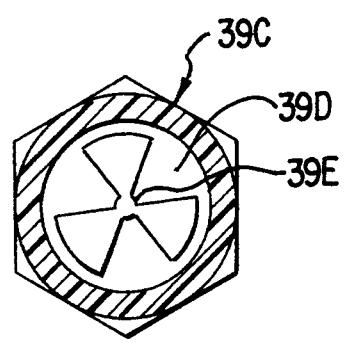

INDUCTION WATT-HOUR METER ROTARY DISC MOUNTING AND BEARING SYSTEM

FIELD OF THE INVENTION

This invention relates generally to induction watt-hour meters and particularly to a bearing system for the rotors of such meters. The bearing system includes end cap pilot bearings secured respectively to opposite ends of the shaft and controlled selective adjustment of the lower shaft support bearing.

BACKGROUND OF THE INVENTION

Watt-hour meters, most commonly used as electric energy billing meters, are simple induction electro-mechanical meters. These meters have proven to have a high degree of accuracy and reliability through many years of service under varying ambient operating conditions. The reliability of these meters is exemplified by the fact that accrediting authorities in countries such as Canada require only sample testing of meters after which the meters can be sealed for a period of twelve years. This seal can be indefinitely extended for periods of up to eight years, depending upon the accuracy criteria of the testing.

The watt-hour meter includes a motor, a magnetic brake and a register. The torque of the motor is proportional to the power flowing through it. The magnetic brake is used to retard the speed of the motor in such a way that the rotation speed is proportional to the power flowing through it (by making the braking effect proportional to the speed of the rotor). The register is used to count the number of revolutions the motor makes. The rotor portion of the meter motor is an electrical conductor in the form of a disc which is placed between the pole faces of the stator. Magnetic fluxes induce emf's in the disc which cause eddy currents that react with the alternating magnetic field, causing torque on the disc. Since the disc is free to turn, the torque causes it to rotate. Since the torque tends to cause constant acceleration, brake magnets are placed around the disc. The strength of the magnet is chosen so that the retarding torque will balance the driving torque at a given speed.

In the existing art, the basic parts of the meter are assembled on a frame, mounted on a base, and then covered with a glass cover. The purpose of the frame is to hold in fixed relation the current stator, potential stator, disc, brake magnets and the register.

In order to support the spindle (shaft) on which the rotor is mounted, bearings that produce a minimum amount of friction are used. In existing meters there is an upper bearing and a lower bearing each slidably mounted in a bore on the frame; each slidable bearing is held by a set screw. This construction is clearly illustrated, for example, in FIG. 2 of U.S. Pat. No. 4,881,070. Each bearing is mounted a flexible pintle (guide pin) of a length which is non-resonant to any vibration frequencies encountered from no-load to maximum load. The upper and lower ends of the disc spindle are centered by graphite or polyamide rings (pilot bearings) that are inserted into recesses in respective opposite ends of the shaft. These pilot bearings function as the bearing surface for the guide pivots.

The spindle assembly is supported by the mutual repulsion of two magnets one being attached to the shaft for rotation therewith and the other mounted in the lower bearing assembly. These are referred to as upper and lower magnets. There is a temperature compensator associated with the lower magnet. The only bearing pressures in this type of rotor support are slight side thrusts on the pintles since the shaft generally does not otherwise touch either the top or bottom supports.

In the existing prior art meters the disc is centered between the brake magnets and stators by vertically moving the upper and lower bearings and using set screws to lock the bearings in position. It is both difficult and awkward to hold the bearing in the desired location while at the same time tightening its set screw, and it is furthermore difficult to gauge the distance that the bearing and hence the disc has travelled in each adjustment. The adjustment thus becomes a tedious trial and error task with no predictability to repetitive adjustments.

SUMMARY OF THE INVENTION

A principal object of this invention is to provide an improved arrangement of the pilot bearing on the ends of the spindle of a watt-hour meter facilitating both its construction and assembly.

A further principal object of this invention is to provide a controllably adjustable bearing support for the rotor's support bearing.

In accordance with one aspect of this invention there is provided a disc rotor assembly for an electro-mechanical induction watt-hour meter including a shaft having a disc secured thereto and a pair of end cap pilot bearings attached to an external end portion of the shaft. In a preferred embodiment the end cap pilot bearings are snap fit onto the ends of the shaft.

In accordance with a further aspect of this invention there is provided a rotor assembly having a magnetic bearing support including an upper and a lower bearing and means for selective controllable adjustment of the lower bearing support, In accordance with a further aspect of this invention there is provided a rotor and support system for an electro-mechanical induction watt-hour meter including a molded housing having an upper bearing guide and a lower bearing guide and support means; a shaft having a disc secured thereto for reacting to induced flux fields of an electro-magnetic system that connects to an electrical supply line; a pair of end cap pilot bearings secured respectively to each of opposite ends of said shaft and cooperating with said respective upper and lower guide means; said lower bearing support including a first permanent magnet secured to said shaft and a second permanent magnet carried by said housing; and controllably adjustable means on said housing supporting said second permanent magnet for selective incremental movement in a direction along the axis of rotation of said shaft. Pintles that are supported project into an aperture in the respective end cap bearings and are aligned with the axis of rotation of the shaft, The pilot bearings are of a plastics material, molded or machine shaped. The pilot bearings preferably have slits in side walls thereof so as to snap fit onto an enlargement formed on the end of the shaft.

BRIEF DESCRIPTION OF THE DRAWINGS

The invention is illustrated by way of example in the accompanying drawings wherein:

FIG. 4 is a partial sectional, part exploded, view of the motor shaft and pilot bearings for the respective opposite ends thereof;

FIG. 5 is an end view of one of the pilot bearings;

FIG. 6 is an enlarged sectional view of an end of the rotor shaft and pilot bearing secured thereto;

FIG. 7 It an exploded view of the lower support bearing for the shaft;

FIG. 8 is a sectional view taken essentially along line 8—8 of FIG. 2; and

FIG. 9 is a sectional view taken essentially along line 9—9 of FIG. 3.

DESCRIPTION OF PREFERRED EMBODIMENTS

Figure 1:
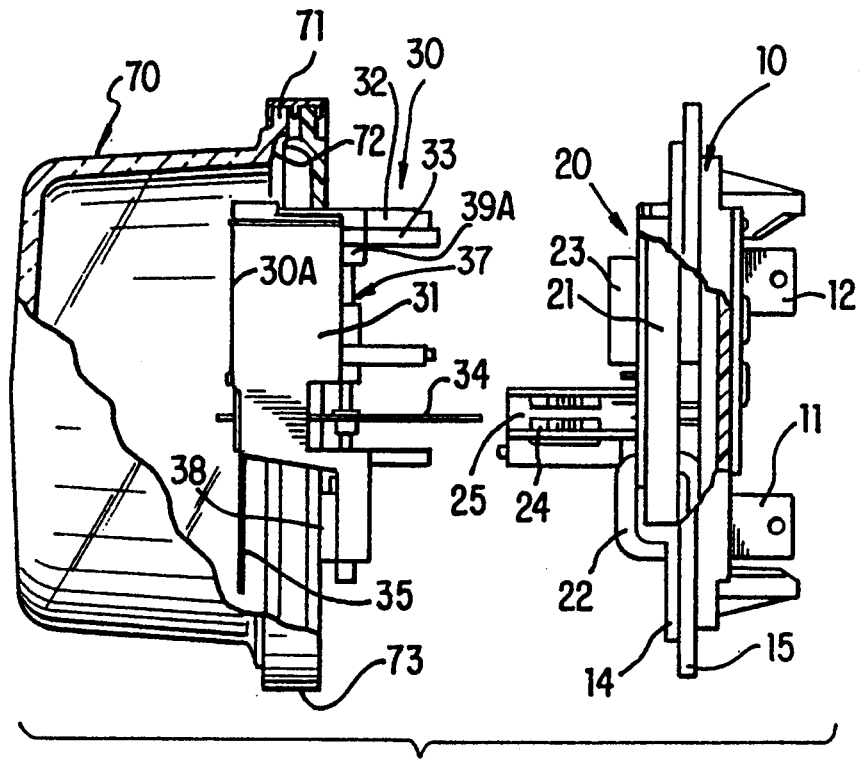
FIG. 1 is an exploded side elevational view illustrating the major components of the electro-mechanical induction watt-hour meter of this invention.

FIG. 1 is an exploded view illustrating the electromechanical induction watt-hour meter of this invention having a molded base 10, an electro-magnetic coil unit 20 with a disc brake magnet mounted thereon, a register and rotor unit 30, and a glass cover 70.

Electro-magnetic coil unit 20 has a core unit 21 with respective current and potential coils 22 and 23 mounted thereon. A magnetic brake 24 is carried by the coil unit 20 and has a gap 25 for receiving a portion of a rotor disc. Electro-magnetic coil unit 20 securely attaches to molded base 10 and has pairs of current terminals 11 and 12 projecting therefrom. There are two current coils and each has two terminals.

Base 10 may be molded conventionally from a hard plastic material, e.g., thermoset plastics such as a phenolic resin (bakelite) or preferably from a rigid thermoplastic resin. Our preferred material is a polycarbonate material identified as #9417 Makrolon ® polycarbonate available from Bayer Company of Germany. The polycarbonate is preferably glass reinforced (about 10% glass) and ultraviolet light stabilized.

Magnetic coil unit 20 attaches to base 10 in a convenient manner, for example, using lugs projecting from the base which position and snap fit onto coil unit 20.

The register and rotor unit 30 is a module that snap fits and locks onto coil unit 20 and includes a molded plastic housing (preferably Ryton ® PPS) 31 having a plurality of spacer lugs 32 projecting therefrom and attaching lugs 33 for precisely locating register and rotor unit 30 relative to coil unit 20 and attaching register and rotor unit 30 to the previously assembled base 10 and a coil unit 20. The register and rotor unit 30 has a register diagrammatically illustrated on its face 30A and a name plate 35 that attaches to and extends downwardly from the molded plastic housing 31. Locating lugs 32 position register and rotor unit 30 relative to coil unit 20 such that a rotatable disc 34 on coil unit 30 projects into coil gap 25 and lugs 33 snap fasten onto, as previously mentioned, coil unit 20 and/or base unit 10.

Figure 2:
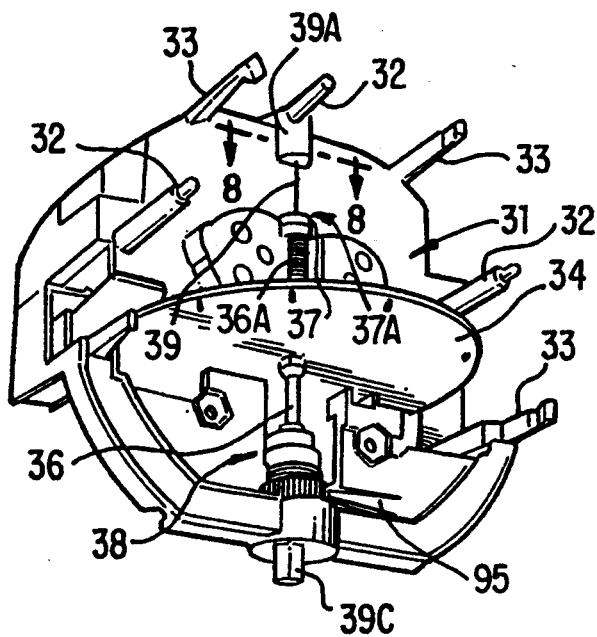
FIG. 2 is an oblique view of the rotor mounted on a housing support and the register.

Referring now to FIGS. 1 and 2, disc 34, which is caused to rotate by electro-magnetic unit 20 in a known manner, is mounted on a shaft or spindle 36 that is journalled on housing 31 by respective upper and lower bearing assemblies 37 and 38. A pintle 39 associated with the upper bearing assembly 37 projects therefrom into a pintle receiving unit 39A on the molded plastic housing 31. Rotor shaft 36 has a worm gear 36A on the upper end thereof that meshes with a drive gear, not shown, for the register unit which visually indicates by dials the cumulative energy consumed.

Glass cover 70 has an outwardly directed flange 71 with a seat portion 72 that abuts against a seal forming rib 14 molded integral with base 10. Outwardly directed flange 71 carries a metal ring 73 provided with lugs that engage tapered ramps on the flange 15 of the base, thereby forming a bayonet-type mount whereby the glass cover and base may be rotated relative to one another to detachably join them together with rib 14 on the base being pressed against seat 72 on the glass cover.

Referring to FIG. 2, this invention is particularly directed to the bearing system and various parts thereof for rotor shaft 36 and incremental adjustment of the rotor shaft support bearing.

Figure 3:
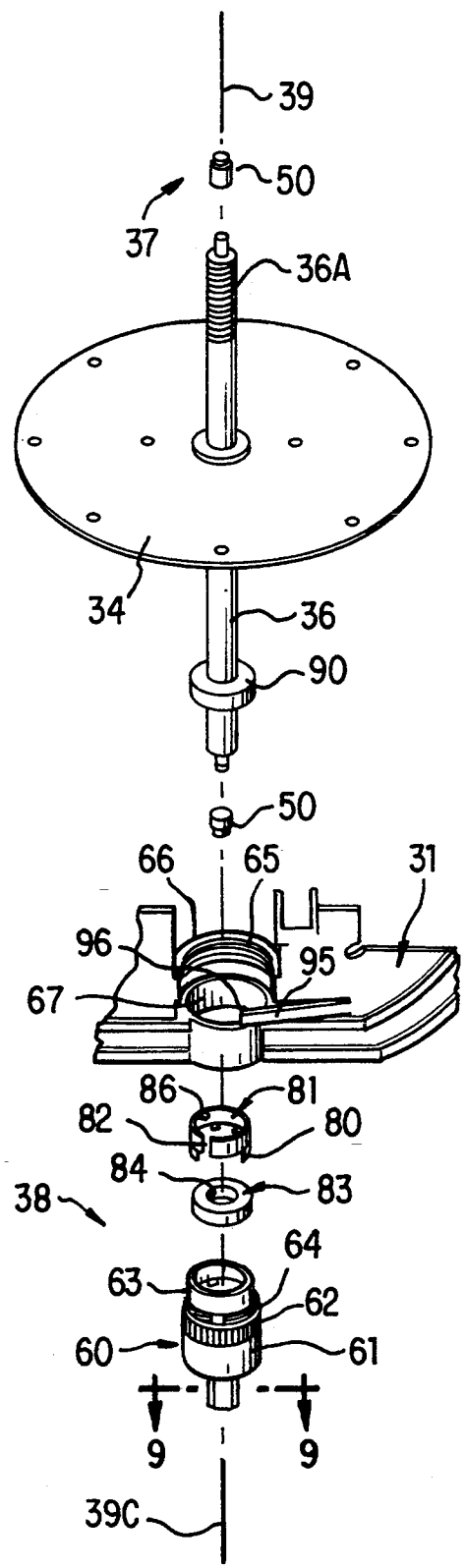
FIG. 3 is an exploded view of the rotor and bearing support assemblies for the same.

Referring to FIG. 3, as previously mentioned, there is an upper bearing assembly 37 and a lower bearing assembly 38, each of which includes a pilot bearing 50 and a pintle (39, 39B). Each pilot bearing (in place of known graphite or polyamide rings pressed into the end of the spindle as in the prior art) is a plastic bearing made of, for example, a polyphenylene sulfide compound (PPS) (available from Phillips 66 Company under the tradename Ryton ®)).

Referring to FIG. 4, each pilot bearing 50 is a cap-type bearing that snap fits onto the end of shaft 36. Each bearing 50 has a series of slits (or areas of reduced strength) 51 that provide a series of legs 52. Legs 52 of the pilot bearing 50 flex outwardly to snap onto an enlargement or rib 36B machined onto a reduced end 36C of shaft 36.

Referring to FIGS. 4 and 6, legs 52 have, on their inner surfaces, a knob or enlarged portion 53 securely anchoring pilot bearing 50 to shaft 36. Shaft 36 has a shoulder 36D against which pilot bearing 50 abuts, ensuring axial alignment of hole 54 in the end of bearing 50 with the axis of rotation of shaft 36. The end 36E of shaft 36 can serve as an abutment for pintle 39 if need be, but, in normal operations there would be no engagement between pintle 39 and the end 36E of shaft 36. The upper end cap bearing 50 fits loosely into an opening provided by a lug 37A on housing 31. (See FIG. 2).

Upper pintle 39 projects into pintle receiving unit 39A which is shown in cross-section in FIG. 8. A lower pintle 39B, shown in FIG. 3, projects into the bottom pilot bearing 50 at one end and at the other end fits into a downwardly projecting stem portion on a lower bearing support portion 60. The pintle receiving portion of the lower bearing support is illustrated in cross-section in FIG. 9 which is taken along essentially line 9—9 of FIG. 3. The upper and lower pintle receiving members are designated respectively 39A and 39C. Each of these have three evenly spaced triangular downwardly directed projections 39D with their apexes directed to a common center. Each apex has a concave area 39E on the end thereof partially to embrace the pintle which is press fit into the space 39F between the apex of the triangular projections.

Referring to FIG. 7, the member 39C is a downwardly projecting portion of a molded plastic lower bearing support housing 60 that has a locating ring portion 61 below ratchet grooves 62 formed about the periphery centrally of the bearing housing. The bearing housing has a sleeve portion 63 with threads 64 formed on the outer surface. These threads mate with threads 65 on a semi-circular part 66 on the molded housing 31 (see FIG. 3). Semi-circular part 66 is co-axial with an annular opening 67 that closely surrounds the bearing support portion 61. Between the bearing support portions 61 and 63 is a wall 68 having spaced apart openings 69 therein for receiving respective ones of a plurality of lugs 80 extending downwardly from a metal split sleeve member 81. The sleeve is split at 82 so as to snugly receive therein an annular permanent magnet 83 having a central aperture 84. Magnet 83, tightly surrounded by sleeve 81, fits into the recess in the top end of bearing support 60 and is firmly anchored in position by bending over the tabs 80 under the wall 68 accessible through access holes 85. Split sleeve member 81 has tabs 86 that are bent inwardly above the magnet to hold the magnet captive in the top end of the bearing support.

Referring again to FIG. 3, the lower bearing support 60, with the lower support magnet 83 therein held captive by temperature compensator sleeve 81, threads into the lower end of housing 31, threads 64 mating with threads 65. This threaded engagement permits moving the lower bearing support axially along the axis of rotation of the rotor by rotating the bearing housing. The lower pilot bearing 50 (FIG. 4) fits loosely into opening 84 of magnet 83 and lower magnet 83 is disposed closely adjacent an upper support magnet 90 secured to the spindle 36. Forces of magnets 83 and 90 opposing one another support the rotor.

Housing 31 has a finger 95 molded integrally therewith (or separately secured thereto) that has a free outer end portion 96 biased into the grooves 62 on member 60. Finger 95 and grooves 62 provide a ratchet for incremental adjustments in rotating the bearing support housing 60 which, when rotated, moves axially along either up or down dependent upon clockwise or counterclockwise rotation so as to adjustably position the rotor assembly. The lower bearing assembly is readily rotated by turning the downwardly protruding head 39C on the bottom end of the housing 60.

It will be readily apparent to those skilled in the art the snap on end cap pilot bearings may be utilized without the adjustable lower bearing assembly and likewise the adjustable lower bearing assembly may be used with conventional pilot bearings that are inserted into the end of the shaft.

Referring again to FIGS. 1 and 2, the register and rotor unit 30 disclosed herein has the register secured to molded plastic housing 31 so as to be positively located relative to worm drive gear 36A. This facilitates assembly with assurance of proper correlation in positioning between the worm drive gear and the drive gear on the register. Raising and lowering of the rotor positions disc 34 appropriately within gap 25 in electro-magnetic unit 20.

The plastics for the molded housing, pilot bearings and meter base are engineering grade resins and preferably rigid thermoplastic materials such as those identified hereinbefore.

It is evident that those skilled in the art may new make numerous uses and modifications of and departures from the specific embodiment described herein without departing from the inventive concept. Consequently, the invention is to be construed as being limited solely by the spirit and scope of the appended claims.

What is claimed is:

1. A rotor bearing system for an electro-mechanical induction watt-hour meter, comprising:
   (a) a rotor including a shaft having a rotatable disc mounted thereon;
   (b) a pair of end cap pilot bearings secured to respective opposite ends of the shaft, said end cap pilot bearings each having:
      (1) a pintle receiving aperture disposed in axial alignment with the axis of rotation of the shaft; and
      (2) outwardly flexing legs for snap fitting onto said shaft; and
   (c) means for incrementally adjusting a location of said rotatable disc to one of a plurality of predetermined positions, said means for incrementally adjusting comprising a bearing support housing for accepting and retaining one of said end cap pilot bearings, said bearing support housing including a rotatable ratchet means and screw means, whereby when said screw means is rotated, said bearing support housing moves up or down and is retained in such position by said ratchet means.

2. The rotor bearing system of claim 1, wherein said shaft has an end portion of reduced thickness with an enlargement thereon and wherein said end cap pilot bearings are snap fit onto said enlargement.

3. A rotor bearing system for an electro-mechanical induction watt-hour meter, comprising:
   (a) a rotor including a rotatable disc secured to a shaft;
   (b) a pair of end cap pilot bearings secured to a respective one of opposite ends of the shaft, said end cap pilot bearings each having a pintle receiving aperture disposed in axial alignment with the axis of rotation of the shaft;
   (c) an adjustable support means for setting a location of the rotatable disc at one of a plurality of predetermined positions, said adjustable support means including screw means for adjusting the height of at least one of said end cap pilot bearings and ratchet means for retaining said height once it has been adjusted; and
   (d) a magnetic bearing support means at a lower end of the shaft, said magnetic bearing support means comprising first and second permanent magnets secured respectively to said shaft and to the adjustable support means to mutually repel each other.

4. The rotor bearing system of claim 3, wherein said second permanent magnet has a central aperture therein loosely receiving an end cap pilot bearing on the lower end of the shaft and wherein said adjustable support means comprises said second magnet mounted in a support housing threadingly mounted for adjustment in a direction back and forth along the axis of the shaft.

5. A rotor support system for an electro-mechanical induction meter comprising:
   (a) a molded housing having an upper bearing guide and a lower bearing guide and lower bearing support means;
   (b) a shaft having a disc secured thereto for reacting to induced flux fields of an electromagnetic system that connects to an electrical supply line;
   (c) a pair of end cap bearings secured respectively one to each of opposite ends of said shaft and cooperating with said respective upper and lower guide means;
   (d) said lower bearing support means comprising a first permanent magnet secured to said shaft for rotation therewith and a second permanent magnet positioned to repel said first permanent magnet; and (e) controllably adjustable support means on said housing supporting said second permanent magnet for selective incremental movement in a direction along the axis of rotation of said shaft, said second permanent magnet including an annular member receiving therein one of said end cap pilot bearings which is secured to said shaft and including a metal sleeve surrounding said second permanent magnet and holding said second permanent magnet captive on said adjustable bearing support means.

6. The rotor support system of claim 5 wherein said sleeve is a split sleeve tightly embracing said magnet associated therewith.

* * * * *